US007406638B2

(12) United States Patent
Clark et al.

(10) Patent No.: US 7,406,638 B2
(45) Date of Patent: Jul. 29, 2008

(54) SYSTEM AND METHOD FOR OPTIMIZED TEST AND CONFIGURATION THROUGHPUT OF ELECTRONIC CIRCUITS

(75) Inventors: Christopher J. Clark, Durham, NH (US); Michael Ricchetti, Nashua, NH (US)

(73) Assignee: Intellitech Corporation, Durham, NH (US)

( * ) Notice: Subject to any disclaimer, the term of this patent is extended or adjusted under 35 U.S.C. 154(b) by 188 days.

(21) Appl. No.: 10/896,646

(22) Filed: Jul. 22, 2004

(65) Prior Publication Data

US 2005/0060622 A1 Mar. 17, 2005

Related U.S. Application Data

(60) Provisional application No. 60/489,312, filed on Jul. 23, 2003.

(51) Int. Cl.
*G01R 31/28* (2006.01)
(52) U.S. Cl. .................................................. 714/724
(58) Field of Classification Search .................. 714/30, 714/724, 730, 734, 757, 772, 773, 820; 371/20
See application file for complete search history.

(56) References Cited

U.S. PATENT DOCUMENTS

| | | | | |
|---|---|---|---|---|
| 4,622,647 | A | 11/1986 | Sagnard et al. ............. | 364/580 |
| 4,760,330 | A * | 7/1988 | Lias, Jr. ...................... | 714/32 |
| 6,134,685 | A * | 10/2000 | Spano ........................ | 714/724 |
| 6,255,844 | B1 | 7/2001 | Kawashima ................ | 324/765 |
| 6,363,504 | B1 | 3/2002 | Rhodes et al. .............. | 714/724 |
| 6,449,741 | B1 * | 9/2002 | Organ et al. ................ | 714/724 |
| 6,557,128 | B1 * | 4/2003 | Turnquist .................... | 714/724 |
| 6,880,116 | B2 * | 4/2005 | Man et al. ................... | 714/718 |
| 2002/0078283 | A1 | 6/2002 | Purcell et al. .............. | 710/109 |
| 2002/0093358 | A1 * | 7/2002 | Kang .......................... | 324/765 |
| 2003/0005376 | A1 * | 1/2003 | Lee et al. .................... | 714/724 |

FOREIGN PATENT DOCUMENTS

WO 01/92904 A2 12/2001

OTHER PUBLICATIONS

Medthod and Apparatus for Optimized Parallel Testing and Access of Electronic Circuits. Ricchetti et al. U.S. Appl. No. 10/119,060, filed Apr. 9, 2002.

* cited by examiner

*Primary Examiner*—Cynthia Britt
*Assistant Examiner*—Guerrier Merant
(74) *Attorney, Agent, or Firm*—Weingarten, Schurgin, Gagnebin & Lebovici LLP

(57) ABSTRACT

A system and method for maximizing the throughput of test and configuration in the manufacture of electronic circuits and systems. The system employs a tester having a flexible parallel test architecture with expandable resources that can accommodate a selected number of units under test (UUTs). The parallel test architecture is configurable to accept separate banks or partitions of UUTs, thereby enabling the system to obtain an optimal or maximum achievable throughput of test and configuration for the UUTs. The system determines an optimal or maximum achievable throughput by calculating a desired number N of UUTs to be tested/configured in parallel. Testing or configuring this desired number of UUTs in parallel allows the handling time to be balanced with the test and configuration times, thereby resulting in the maximum achievable throughput.

8 Claims, 10 Drawing Sheets

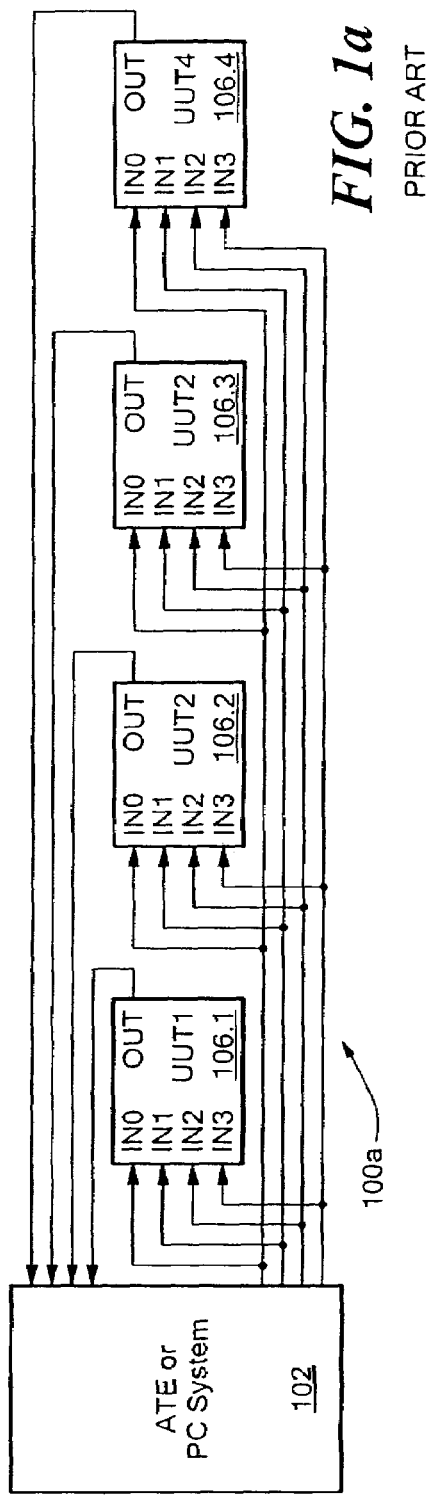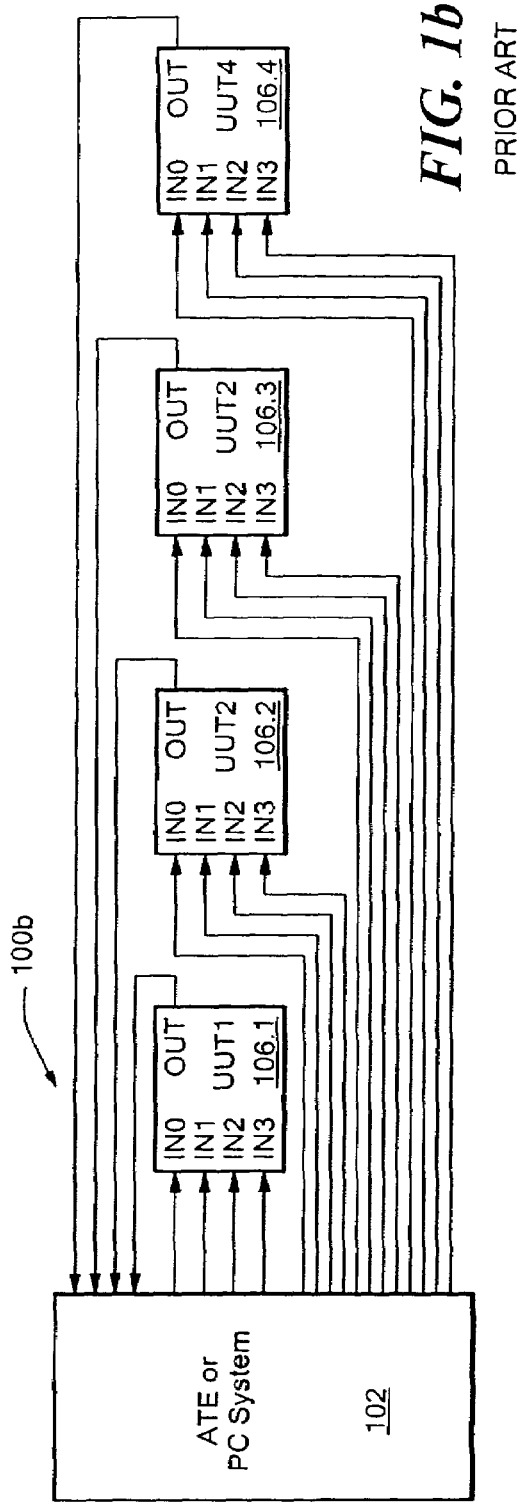

US 7,406,638 B2

SYSTEM AND METHOD FOR OPTIMIZED TEST AND CONFIGURATION THROUGHPUT OF ELECTRONIC CIRCUITS

CROSS REFERENCE TO RELATED APPLICATIONS

This application claims the priority of U.S. Provisional Patent Application No. 60/489,312 filed Jul. 23, 2003 entitled SYSTEM AND METHOD FOR OPTIMIZED TEST AND CONFIGURATION THROUGHPUT OF ELECTRONIC CIRCUITS.

STATEMENT REGARDING FEDERALLY SPONSORED RESEARCH OR DEVELOPMENT

N/A

BACKGROUND OF THE INVENTION

The present application relates generally to the manufacturing of electronic circuits and systems, and more specifically to a system and method of achieving improved test and configuration throughput of electronic circuits (e.g., integrated circuits (ICs)), printed circuit boards (PCBs), and electronic sub-assemblies and systems. The presently disclosed system and method employ a tester resource (e.g., a computer and controller) that uses a parallel test architecture. Further, the disclosed system and method are operative to calculate an optimal number of units (e.g., ICs or PCBs) to test and/or configure in parallel, thereby allowing manufacturers to achieve both maximum test and configuration throughput and maximum utilization of the tester resource.

In recent years, there has been a significant increase in the cost of testing and configuring electronic circuits and systems. One factor contributing to the higher test and configuration costs is the increased use of programmable memories such as FLASH, and programmable logic devices such as Complex Programmable Logic Devices (CPLDs) and Field Programmable Gate Arrays (FPGAs). Another contributing factor is the increased size and complexity of these programmable devices. These factors have resulted in an increased amount of configuration data, which is typically programmed into ICs, PCBs, and electronic systems during manufacturing. As a result, the time required to program such configuration data has increased, thereby increasing manufacturing and end-product costs, which are typically passed along to the customer.

Still another factor contributing to higher product costs is the continuing increase in manufacturing test times. Electronic products are normally tested following fabrication and assembly to assure that no defects have been introduced into the manufacturing process. As such electronic products have continued to offer more features, higher performance, and reduced size, the ICs and PCBs used to make these products have become more complex and more highly integrated. This has resulted in increased amounts of test data and increased manufacturing test times, which have further increased manufacturing and end-product costs.

Test and configuration of ICs, PCBs and electronic sub-assemblies and systems are typically automated to facilitate production manufacturing. Such automation, in the form of Automated Test Equipment (ATE) and automated handlers for the units under test (UUTs), speeds production and reduces labor costs. For example, UUTs such as packaged ICs and PCBs may employ ATE and automated handlers during the manufacturing process. Each ATE typically employs a dedicated handler that automatically loads a UUT into a test fixture on the ATE, which then tests and/or configures the UUT. After the UUT is tested and configured, the automated handler unloads the UUT from the ATE, and loads a new UUT into the ATE test fixture for subsequent testing and configuration. The handler-tester pair, often referred to as a test cell, continues this process of loading, testing/configuring, and unloading the UUTs. The time required for the handler to manipulate the UUTs for test/configuration, i.e., for loading and unloading the UUTs, is typically referred to as the "index time".

The time required for the automated handler to sort the UUTs that have failed testing from those that have passed is known as the "sort time". The sorting process frequently merely involves marking the failing UUTs. For example, during wafer testing, a failing die may be marked with an ink dot. In other sorting techniques, the test cell may "map" the pass/fail results, and log the map onto a computer for subsequent sorting off-line. Accordingly, the sort time is generally insignificant when compared to the index, test, or configuration times, as it can be easily masked so that the throughput of the manufacturing line and the tester utilization are not unduly impacted by the sorting method.

Even with automated handlers and testers, manufacturers often employ additional techniques to improve test and configuration throughput including ganged test and configuration and multi-site testing, in which multiple UUTs are tested and configured in parallel. In this way, multiple UUTs can be tested and configured in the same amount of time as a single unit, thereby reducing the effective per-unit test/configuration times. Such techniques can improve throughput, especially when the index times are significantly shorter than the per-unit test and configuration times. However, merely increasing the number of UUTs that are tested and configured in parallel is not always enough to achieve a desired level of throughput, even when massively parallel testing techniques are employed. Further, parallel testing alone does not always result in the maximum achievable level of throughput. Moreover, conventional parallel testing techniques are often prohibitive in terms of cost.

Although conventional testers can be used for ganged and multi-site test and configuration, such testers are typically limited in the number of units that can be tested and configured in parallel. Such limitations are inherent in the tester's architecture, which depends on individual tester channels and the pattern memory associated with these channels to provide the parallelism required for multi-site testing. Because the channels and memory are limited in number and capacity in these tester architectures, there is a limit to the number of units that can be tested or configured simultaneously. Depending on the requirements of the UUT and the limitations of the tester, conventional testers are typically capable of testing only from 2 to 1024 units in parallel. As such, conventional tester architectures are not readily scalable for parallel testing, and so their costs often rise prohibitively as the requirements for parallelism and tester resources increase.

FIG. 1a depicts a conventional ATE or personal computer (PC) system 100a configured to perform ganged test and configuration. As shown in FIG. 1a, there are 4 UUTs 106.1-106.4 connected to a single ATE or personal computer (PC) 102. Each one of the UUTs 106.1-106.4 is of the same type, i.e., they are identical circuits (ICs or PCBs) with respect to their design and intended functionality, and each UUT 106.1-106.4 has the same number of inputs and outputs. In the ganged configuration, each one of the UUT inputs IN0, IN1, IN2, and IN3 is bused and sourced from the ATE or PC 102. The ATE or PC system 100a therefore supplies outputs corresponding to the IN0, IN1, IN2, and IN3 inputs, which connect to the respective IN0, IN1, IN2, and IN3 inputs of the UUTs 106.1-106.4. The ATE or PC 102 therefore provides input data to each one of the four UUTs 106.1-106.4 simultaneously such that all of the UUTs receive the same test data as inputs. This bused configuration for the inputs of the UUTs 106.1-106.4 provides the benefit of requiring fewer tester channels to control the inputs of the UUTs. However, there is a drawback in that an individual UUT cannot receive test data separate from the other UUTs 106.1-106.4. For example, if unique serial numbers need to be programmed into each one of the UUTs 106.1-106.4, this would not be possible with the ganged test configuration 100*a* of FIG. 1*a*.

To allow one of the UUTs 106.1-106.4 to receive test data separately from the other UUTs 106.1-106.4, the individual inputs of each UUT would normally have to be controlled by discrete tester channels, as depicted in the multi-site test configuration 100*b* of FIG. 1*b*. However, because PCBs and ICs may have hundreds or even thousands of inputs and outputs, the number of inputs/outputs may rapidly exceed the number of tester channels available, even for relatively small numbers of UUTs. A further consideration when using either of the above-described approaches of FIGS. 1*a*-1*b* is that the ATE or PC 102 is capable of driving only a limited number of loads (i.e., UUTs) due to drive limitations of the tester pin electronics. As such, the ganged test and multi-site test configurations 100*a*-100*b* of FIGS. 1*a*-1*b* are not readily expandable, and so it is typical that only a relatively small, limited number of UUTs can be tested and configured in parallel with these tester configurations.

FIGS. 1*a*-1*b* also depict the connections from the outputs of the UUTs 106.1-106.4 to the ATE or PC 102 for ganged test and multi-site test, respectively. As shown in FIGS. 1*a*-1*b*, the UUT outputs are not bused, but rather they are individually connected to a single tester channel of the ATE or PC 102. Multiple outputs cannot be connected together, as there would be contention should the outputs drive opposite logic values. In addition, connecting each output back to the ATE or PC 102 individually enables the tester to check the response of each UUT during test or configuration, and to determine which UUTs 106.1-106.4 have passed or failed testing/configuration. A dedicated output line back to the ATE or PC 102 for each output of every UUT is therefore required. In the testers of FIGS. 1*a*-1*b*, each UUT has one output, and there are four UUTs. Four tester channels are therefore used on the ATE or PC 102. As a result, for conventional ganged test and multi-site test configurations, the number of output signals connected from the UUTs back to the ATE or PC can be very large, depending on the number of UUTs and the number of outputs per UUT. For example, given eight UUTs, each having 200 outputs, 1600 separate tester channels on the ATE or PC 102 would be required to perform the ganged or multi-site testing.

It is noted that test configurations such as those depicted in FIGS. 1*a*-1*b* are also possible by configuring multiple testheads on a single ATE (typically no more than 4 testheads) operating asynchronously. However, this can be a costly approach to expanding the tester, and there is still a limit to the number of parallel sites that can be configured for a particular type of UUT.

Although there are alternative ways that ganged and multi-site testing can be configured and performed, these alternative approaches also have limitations in the number of UUTs that can be tested and configured simultaneously. This is primarily due to considerations for connecting the UUT inputs and outputs to the ATE or PC. Such limitations are typically inherent in the ATE architectures and the approaches used.

Further, the number of UUTs that can be tested simultaneously using conventional ATE is often relatively small in number. Consequently, with these conventional approaches, the number of UUTs that can be handled, tested, and configured in parallel is generally dictated by the limitations of the ATE or PC system, and not the requirements for test and configuration throughput.

FIG. 2 depicts another conventional parallel test system 200, which uses a distributed network such as a computer network 210 (e.g., Ethernet) to network together a number of ATEs via the console workstations of the testers 212.1-212.5. As shown in FIG. 2, a computer 202 on the network is used to provide a centralized test supervisor/monitor. This arrangement provides for a parallel test and configuration environment with multiple/independent tester resources (ATEs) and expandable bandwidth, in which the independent tester resources operate asynchronously to one another. However, expansion using the approach of FIG. 2 can be costly because it typically requires the addition of one or more ATEs and ATE consoles.

Another consideration involves the handling techniques employed, and how they affect throughput when combined with parallel testing. For example, with multi-site testing, multiple UUTs are typically handled in parallel as a group, as opposed to handling each UUT sequentially. With multiple UUTs handled in parallel, it effectively reduces the per-unit handling time. Although the combined handling time for handling multiple UUTs simultaneously (i.e., in parallel or as a group) often takes longer then handling a single UUT sequentially, the effective index time per UUT is still reduced. As a result, when the test time is significantly greater than the index time, handling multiple UUTs as a group essentially masks some of the indexing time. For example, during wafer test, multiple die may be indexed simultaneously. In this case, the handler probes multiple die on the wafer and the ATE tests these multiple sites simultaneously, thereby reducing both the per-unit index time and per-unit test time that would otherwise be incurred by handling and testing one die at a time. Techniques for racking PCBs so that multiple boards can be handling simultaneously may also be employed.

Still another conventional handling technique involves handling one UUT while another UUT is being tested. This approach has been used for PCB testing and is often referred to as "dual well" testing, typically with "left" and "right" wells, as the test fixtures are designed with two wells for accepting one PCB, i.e., "PCB left", while the other PCB, i.e., "PCB right", is being tested. When "PCB right" finishes its test, the test for "PCB left" begins automatically, and the tested "PCB right" is removed and a new PCB is inserted in the "right" well. However, this approach does not use parallel testing, and typically does not provide for an optimal level of throughput. Dual well testing only affects the overall throughput by reducing the handling time for removing a tested PCB and inserting another PCB. Overall test times are not reduced. Dual well fixtures are sometimes designed such that the wells are wired together when the test channels needed for the PCB exceed more than half of the ATE test channel resources. In this case, there are "shared" wires between the ATE and the fixture well. Such an arrangement may contribute to signal integrity problems in the test environment, especially when testing high-speed signals on the PCBs.

Accordingly, the conventional techniques described above for providing test and/or configuration of ICs, PCBs, and electronic sub-assemblies and systems are generally incapable of providing an optimal or maximum achievable level of throughput. Although this is due at least in part to the limitations of the ATE or PC system, it is primarily due to the misconception that simply increasing the number of UUTs tested and configured in parallel will result in an increased throughput. With conventional approaches, the test/configuration time and/or the handling time are not fully masked in the test cell, and therefore the throughput is reduced. With a single tester resource, there is little flexibility in adjusting the handling or determining the number of UUTs that can be tested and configured in parallel. This is because the throughputs are typically dictated by cost and resource limitations of the ATE, e.g., the number of available tester channels compared to the number of pins per die required for configuration and test. Increasing the number of tester-handler pairs may achieve a higher overall throughput, when considering a combination of multiple test cells. However, this approach can be prohibitive given the costs of adding such expensive capital equipment to a manufacturing line.

It would therefore be desirable to have an improved, low cost system and method of testing and configuring electronic circuits and systems that may be employed to obtain an optimal or maximum achievable throughput of test and configuration for ICs, PCBs, and any other suitable electronic sub-assembly or system, while avoiding the drawbacks of the above-described conventional approaches.

BRIEF SUMMARY OF THE INVENTION

In accordance with the present invention, a system and method are provided for maximizing the throughput of test and configuration in the manufacture of electronic circuits and systems. The presently disclosed system and method employ a tester having a flexible parallel test architecture with expandable resources that can accommodate a selected number of units under test (UUTs). The parallel test architecture is configurable to accept separate banks or partitions of UUTs, thereby enabling the system to obtain an optimal or maximum achievable throughput of test and configuration for the UUTs. The presently disclosed system and method determine an optimal or maximum achievable throughput by calculating a desired number N of UUTs to be tested/configured in parallel. Testing or configuring this desired number of UUTs in parallel allows the handling time to be balanced with the test and configuration times, thereby resulting in the maximum achievable throughput.

In one embodiment, the system comprises a single test cell and a handling resource for testing and/or configuring a first plurality of N UUTs on a first tester partition, while handling a second plurality of N UUTs on a second tester partition. The single test cell includes a single tester having a parallel test architecture. Because the single tester incurs a minimum amount of idle time, the presently disclosed system achieves maximum utilization of the tester.

In another embodiment, the system comprises a first sub-system including a first test bus, and a plurality of first addressable test controllers coupled to the first bus and coupleable to a plurality of first electronic circuits. The first circuits are communicably coupleable to the first bus via the first addressable controllers, respectively. The system further includes a second sub-system including a second test bus, and a plurality of second addressable test controllers coupled to the second bus and coupleable to a plurality of second electronic circuits. The second circuits are communicably coupleable to the second bus via the second addressable controllers, respectively. Moreover, the system includes electronic circuit handling equipment for loading the first and second circuits into first and second pluralities of test fixtures corresponding to the first and second sub-systems, respectively, and for unloading the first and second circuits from the first and second pluralities of test fixtures. In addition, the system includes a test controller coupled to the first and second sub-systems by the first and second buses, respectively. The test controller is operative to apply input data to the first and second circuits via the first and second sub-systems, respectively, and to receive output data from the first and second circuits via the first and second sub-systems, respectively, for testing or configuring the electronic circuits. The test controller is further operative to test or configure the circuits corresponding to one of the first and second sub-systems while the handling equipment is unloading and loading the circuits corresponding to the other one of the first and second sub-systems. The time required for testing or configuring the circuits is substantially equal to the time required for unloading and loading the circuits.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the Drawings of which:

FIG. 1a is a block diagram of a conventional ganged testing configuration;

FIG. 1b is a block diagram of a conventional multi-site testing configuration;

DETAILED DESCRIPTION OF THE INVENTION

U.S. Provisional Patent Application No. 60/489,312 filed Jul. 23, 2003 entitled SYSTEM AND METHOD FOR OPTIMIZED TEST AND CONFIGURATION THROUGHPUT OF ELECTRONIC CIRCUITS is incorporated herein by reference.

A system and method are disclosed for maximizing the throughput of test and configuration in the manufacture of electronic circuits and systems. The presently disclosed system comprises a single test cell including a single tester having a parallel test architecture, and a handling resource for concurrently testing and/or configuring a plurality of ICs, PCBs, electronic sub-assemblies or systems (units under test, UUTs). An illustrative embodiment of the parallel test architecture employed in the presently disclosed system is described below, followed by a description of a method of balancing the handling time with the test and configuration times to obtain a maximum achievable manufacturing throughput.

Parallel Test Architecture

Figure 3:
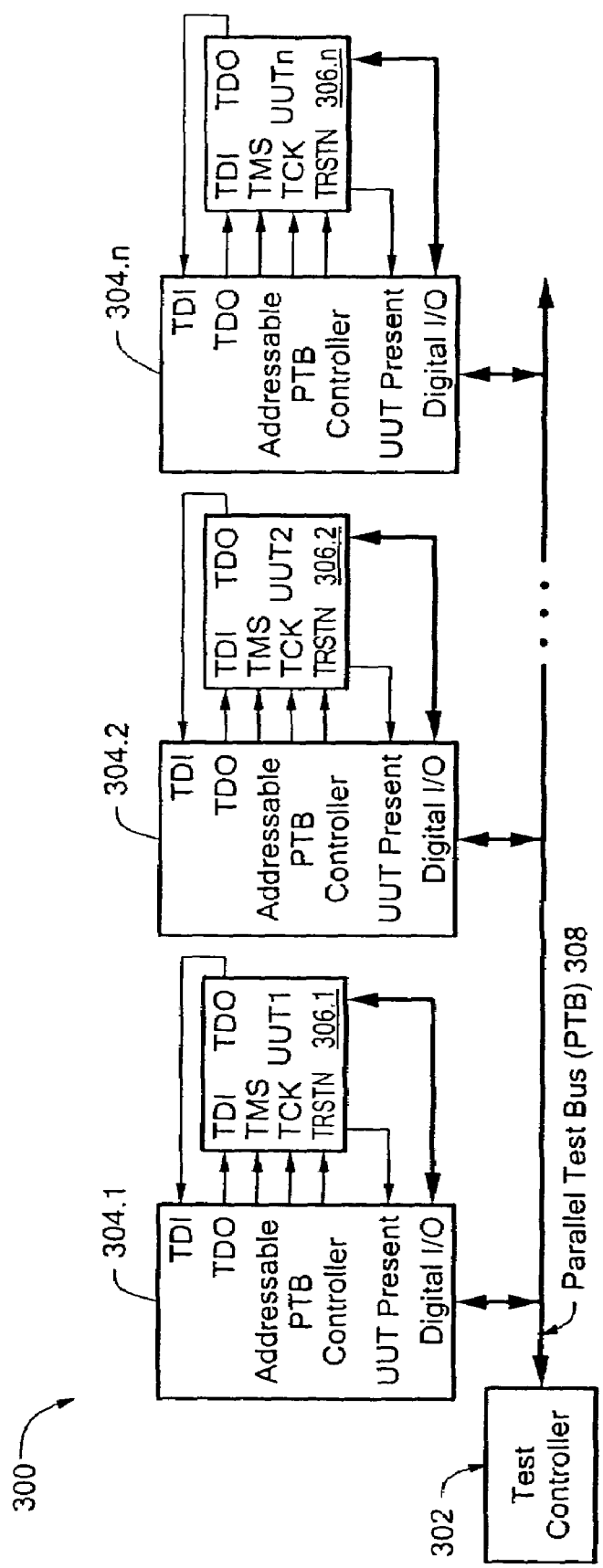
FIG. 3 is a block diagram of a parallel test architecture.

FIG. 3 depicts an illustrative embodiment of a parallel test architecture (PTA) 300 employed in the presently disclosed system for maximizing test and configuration throughput, which is defined herein as the number of UUTs that finish test and configuration per unit time. As shown in FIG. 3, the PTA 300 includes a test controller 302 connected to a parallel test bus (PTB) 308. For example, the PTA 300 may comprise the parallel test architecture described in co-pending U.S. patent application Ser. No. 10/119,060 filed Apr. 9, 2002 entitled METHOD AND APPARATUS FOR OPTIMIZED PARALLEL TESTING AND ACCESS OF ELECTRONIC CIRCUITS, which is incorporated herein by reference. For example, the test controller 302 may comprise a peripheral test apparatus such as a PC-based scan controller. The test controller 302 is configured to communicate over the PTB 308. The PTA 300 is configured such that each one of the UUTs 306.1-306.n is accessible over the PTB 308 via one of a plurality of addressable PTB controller circuits 304.1-304.n. In the presently disclosed embodiment, the PTA 300 includes n UUTs 304.1-304.n accessible over the PTB 308, in which any suitable number of like UUTs may be tested and/or configured in parallel. In addition, any one of the UUTs 306.1-306.n may be addressed and accessed individually. In the preferred embodiment, the PTB controllers 304.1-304.n are implemented on separate PCBs that can be installed in a backplane carrying the PTB signals. For example, the protocol used to communicate locally between a respective one of the PTB Controllers 304.1-304.n and a UUT coupled thereto may be the standard IEEE 1149.1 protocol or any other suitable protocol.

Figure 4:
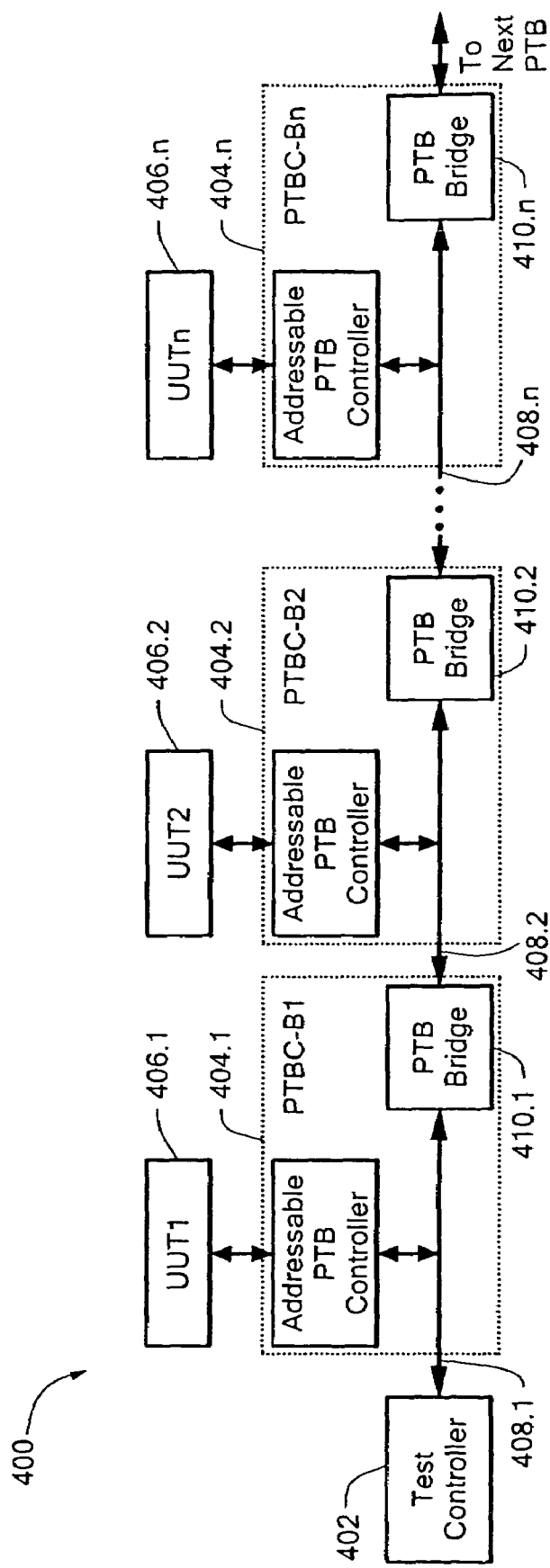
FIG. 4 is a block diagram of an alternative embodiment of the parallel test architecture of FIG. 3.

FIG. 4 depicts an alternative embodiment 400 of the parallel test architecture employed in the presently disclosed system. Specifically, the PTA 400 comprises a bridged PTB configuration of the parallel test architecture. As shown in FIG. 4, the PTA 400 includes n linked PTBs 408.1-408.n, in which each PTB 408.1-408.n is connected to a respective one of a plurality of PTB Controllers 404.1-404.n. The PTA 400 can therefore accommodate a selected number of UUTs 406.1-406.n by linking adjacent PTBs with a PTB bridge circuit, such as PTB bridge circuits 410.1-410.n. Accordingly, by using an addressable PTB controller and a PTB bridge for each UUT, the PTA 400 can be easily expanded. The PTA 400 is not limited to a fixed number of UUTs. It is noted that the PTB controller(s) and PTB bridge(s) for each UUT or for multiple UUTs may be combined into a single IC or PCB to facilitate the expansion of the PTA 400.

Parallel Test System

Figure 5:
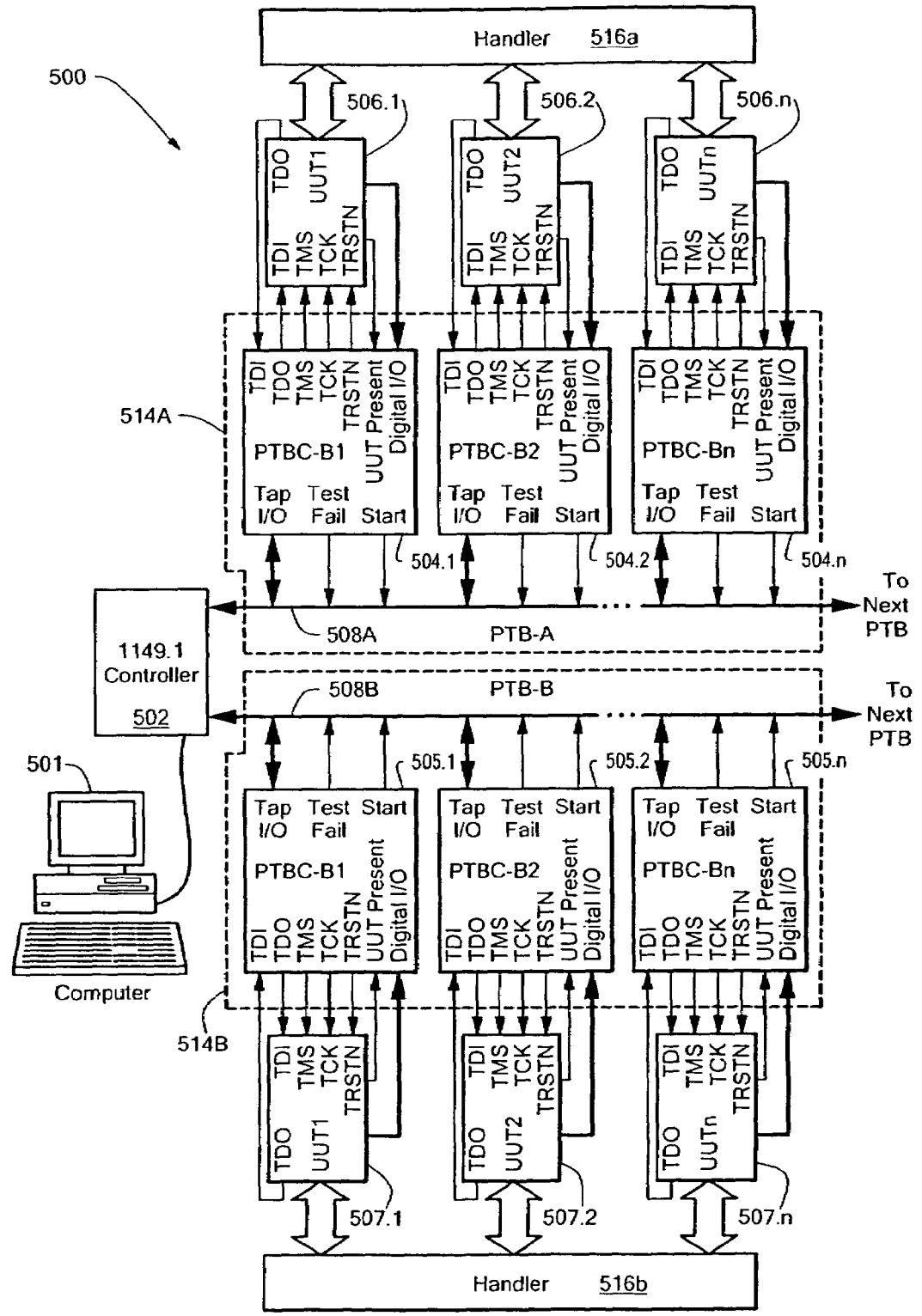
FIG. 5 is a block diagram of a system for maximizing the throughput of test and configuration in the manufacture of electronic circuits and systems according to the present invention, in which the system has a parallel test architecture.

FIG. 5 depicts an illustrative embodiment of a parallel test system 500, in accordance with the present invention. The system 500 is configured to allow multiple UUTs 506.1-506.n, 507.1-507.n to be tested, debugged, and configured in parallel. The system 500 can be expanded while assuring that the test and configuration throughput of the UUTs 506.1-506.n, 507.1-507.n is at a maximum achievable level.

In the illustrated embodiment, the parallel test system 500 comprises two partitions 514A-514B including two parallel test buses (PTBs) 508A-508B, respectively. As shown in FIG. 5, the UUTs 506.1-506.n, 507.1-507.n are loaded into and unloaded from respective test fixtures by suitable electronic circuit handling equipment such as UUT handlers 516A-516B. The UUTs 506.1-506.n are connected to the parallel test bus 508A via respective addressable PTB controller circuits 504.1-504.n. Similarly, the UUTs 507.1-507.n are connected to the parallel test bus 508B via respective addressable PTB controller circuits 505.1-505.n. The addressable PTB controller circuits 504.1-504.n, 505.1-505.n are described in the above-referenced U.S. patent application entitled METHOD AND APPARATUS FOR OPTIMIZED PARALLEL TESTING AND ACCESS OF ELECTRONIC CIRCUITS. It is noted that any suitable number of UUTs 506.1-506.n, 507.1-507.n may be accessed in parallel for testing, configuration, and/or debugging purposes via the respective partitions 514A, 514B. Alternatively, the UUTs 506.1-506.n, 507.1-507.n may be accessed individually.

In the presently disclosed embodiment, a test controller 502 provides the PTB protocol for the partitions 514A-514B. For example, the test controller 502 may comprise any suitable serial test controller such as an IEEE 1149.1 test controller, any suitable test controller designed for use with parallel pin electronics, or any other suitable test controller. Such partitioning may be accomplished by the test controller 502 switching between the partitioned test buses 508A-508B, or by using group addresses to establish the partitions. It should be understood that the presently disclosed system 500 comprises a single tester resource including the 1149.1 controller 502 and a computer 501, may comprise any suitable type of automatic test equipment (ATE) such as an in-circuit tester (ICT) or a personal computer (PC) based boundary scan tool. The single tester resource controls the test buses 508A-508B included in the partitions 514A-514B, respectively.

The presently disclosed method of balancing handling time with test and configuration times to obtain a maximum achievable manufacturing throughput is performed by alternating between the partitions 514A-514B. The method is such that, while a first number of UUTs (e.g., UUTs 506.1-506.n) are in the process of being tested and configured in parallel on the partition 514A, a second number of UUTs (e.g., UUTs 507.1-507.n) are simultaneously being handled (e.g., previously tested UUTs are being unloaded and new UUTs are being loaded) on the other partition 514B. When the number of UUTs 507.1-507.n being handled is balanced with the time for testing and configuring the UUTs 506.1-506.n, the system 500 provides an optimized throughput for the testing/configuration of the UUTs 506.1-506.n, 507.1-507.n. In effect, the system 500 employs a single handling stream and a single test/configuration stream, in which the loading and unloading of UUTs are not concurrent (or overlapped) and do not require independent tester resources.

Figure 6A:
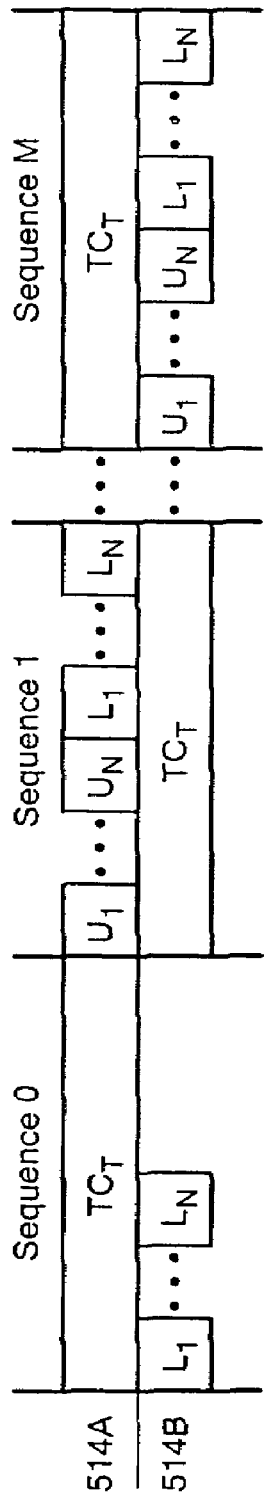
FIG. 6a is diagram of a first exemplary timeline of a parallel test sequence performed by the system of FIG. 5.

FIG. 6a depicts exemplary configuration, test, and handling sequences for the presently disclosed parallel test method. In FIG. 6a, the following notation is used: N=Number of UUTs to test and configure in parallel, $TC_T$=Total Test and Configuration time, U=Per-unit Unload time, and L=Per-unit Load time. The sequences of FIG. 6a start with N UUTs being loaded into the partition 514A, and with the partition 514B being empty. The N UUTs 506.1-506.n of partition 514A are then tested and configured (this is shown in FIG. 6a as time $TC_T$ in Sequence 0), while N new UUTs 507.1-507.n are loaded into the partition 514B. These N new UUTs 507.1-507.n in partition 514B are loaded sequentially, as indicated by the $L_1$ through $L_N$ times in Sequence 0 of FIG. 6a. When the UUTs 506.1-506.n of partition 514A are finished being tested and/or configured, the partition 514B begins its test and configuration functions. This is indicated as time $TC_T$ in Sequence 1 of FIG. 6a. Concurrent with this, the UUTs 506.1-506.n that finished their test and configuration on partition 514A (i.e., during the previous sequence, Sequence 0) are unloaded, and the partition 514A is then loaded with N new UUTs. This is indicated as times U$hd$ 1-U$_N$ and L$_1$-L$_N$ in Sequence 1 (see FIG. 6$a$). Starting with Sequence 1, it can be seen that the throughput of this method is N UUTs per sequence.

Figure 2:
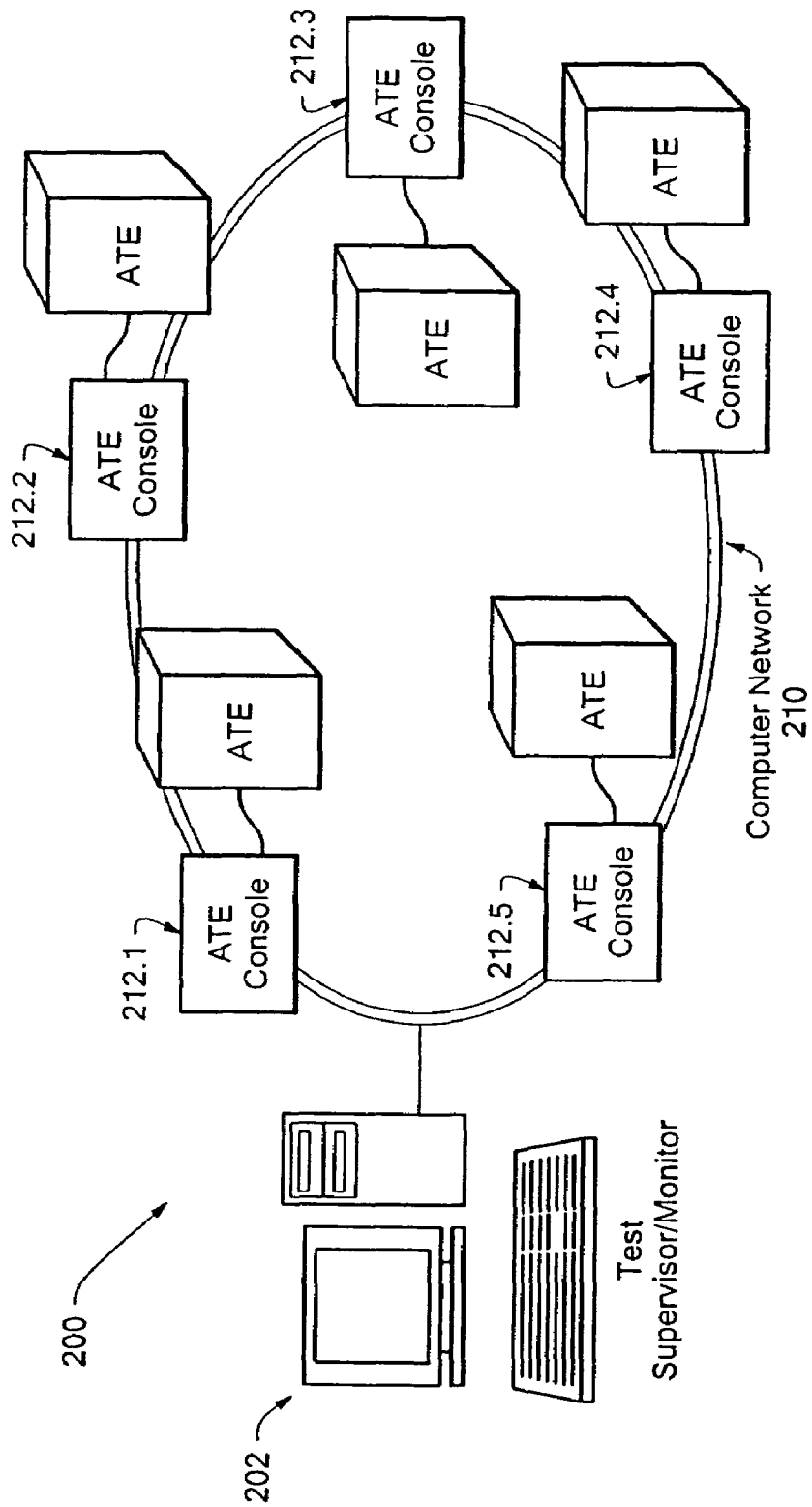
FIG. 2 is a block diagram of a conventional network-based distributed test environment.
Figure 6B:
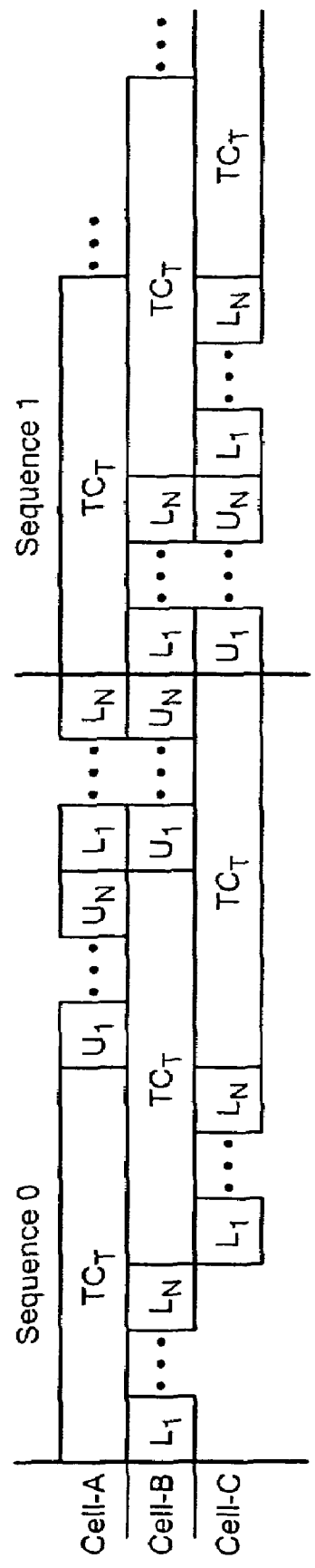
FIG. 6b is a diagram of a second exemplary timeline of a parallel test sequence performed by the system of FIG. 5.

FIG. 6$b$ depicts the configuration, test, and handling for three independent test cells Cell-A, Cell-B, and Cell-C. These test cells Cell-A, Cell-B, and Cell-C can operate asynchronously, as in the distributed test environment of FIG. 2, and can also perform parallel test. Because there are now three separate tester-handler pairs that can operate asynchronously with respect to one another, it is possible to overlap the configuration, test, and handling steps between the three cells. Comparing the test cell configuration and overlapping sequence of FIG. 6$b$ with the sequence of FIG. 6$a$, it can be seen that the test and configuration throughput is improved by about 50%. This improvement comes at a cost, however, as the three independent tester-handler pairs required for the sequence of FIG. 6$b$ would be much more expensive than that of the single parallel tester. In addition, by simply adding a second parallel tester running asynchronous to the first parallel tester, the throughput would be better than the three independent test cells by about 33%, while adding a third parallel tester would make the throughput about twice that of the three test cell method. Accordingly, the reduced cost and increased throughput of the parallel test system 500 (see FIG. 5) provide advantages over conventional ATE systems and methods.

It should be noted that in Sequences 1-M of FIG. 6$a$, there may be gaps following either the test and configuration time or the handling time. So, whereas FIGS. 6$a$-6$b$ depict an equal balance at the times when the TC$_T$ and the U$_1$-U$_N$ and L$_1$-L$_N$ sequences complete, depending on the times, one or the other of the handling or the test/configuration may take longer to complete. In these cases, the throughput will be dominated by the sequences that take longer. In other words, either the handling time or the test/configuration time will determine the throughput.

A characteristic of the presently disclosed method is that a desired number of UUTs to handle for each of the partitions 514A-514B, such that the maximum achievable throughput is obtained, can be readily calculated. This desired number of UUTs to be tested and configured in parallel is herein referred to as "N". The number N is determined such that the time required to handle the N UUTs on one partition is balanced with the test and configuration time of the other N UUTs on the other partition. So, while N UUTs are being handled on one partition of the PTB, the other partition is being used to test and configure N different UUTs such that the operations on each partition take an approximately equal amount of time to complete. In addition, the tester utilization is at its maximum achievable level when N is chosen for the optimal throughput. The number N may be derived using the equation $$TC_T = N*(U+L). \tag{1}$$

The test and configuration time "TC$_T$" in equation (1) represents the total time that the UUTs spend on the tester, i.e., the total time required before the UUTs can be unloaded and replaced with the next set of N UUTs. A portion of this time may be sequential test and configuration time, which is applied on a per-UUT basis and not in parallel, and must be properly accounted for to calculate the optimal N. Sequential per-UUT time corresponds to any non-parallel test or configuration operations, which are unique to each individual UUT and applied to all UUTs in sequence. As these operations are specific to each individual UUT, they are not done in parallel over the PTB, but rather are executed one UUT at a time. However, in these cases, the operations take a predetermined amount of time, and can therefore be deterministically accounted for when calculating N. Examples of sequential per-UUT time are the time required for checking the pass/fail status of each PTB controller when there is a test fail condition on the PTB, and the time required for programming each UUT with a serial number.

It is noted that there may be other types of sequential test and configuration operations that do not take a predetermined time, or do not need to be performed on a per-UUT basis (i.e., not performed on every UUT in the partition). In these cases, the sequential time required cannot be predetermined, and therefore cannot be accounted for prior to test and configuration of the UUTs. For example, a faulty die may require specific instruction and data sequences to be applied in order to repair a defect in an embedded memory circuit. Another example is diagnostic failure data that is stored in the parallel test system, which needs to be retrieved and logged for each one of the failing UUTs. The time required for such operations typically vary for a given set of N UUTs, as it may need to be performed on just a single UUT or on only a few UUTs. In the presently disclosed embodiment, these types of sequential operations are not used to calculate the optimal N, and are considered to be true overhead time that is not optimized out. Accordingly, the handling needs to wait for these non-deterministic, sequential, test and configuration operations to complete before it can continue.

For sequential test and configuration time that is applied on a per-UUT basis and has a predetermined time, TC$_T$ may be expressed as $$TC_T = TC_P + N*(T_S+C_S), \tag{2}$$

in which
TC$_P$=Parallel Test and Configuration time
T$_S$=Sequential Test time per unit
C$_S$=Sequential Configuration time per unit.

Consequently, N can be calculated as follows:

$$TC_P + N*(T_S+C_S) = N*(U+L),$$

$$N = TC_P/(U+L-T_S-C_S). \tag{3}$$

Given equation (3), N falls into one of four ranges, depending on which component of the test and configuration process, i.e., the handling time, the total test and configuration time, or the sequential test and configuration time, dominates in the equation. It should be noted that since there are no "fractions" of a UUT, the value of the expression on the right hand side of equation (3) is rounded upward to the nearest integer to obtain N (this is commonly referred to as the CEIL, or ceiling, function in mathematics). The four ranges for N may be classified as follows:

1. 0<N≦1 (i.e., N=1 for practical purposes). In this first range, test and configuration of multiple UUTs in parallel is not necessary to obtain the maximum achievable throughput. However, there is still a benefit to using the presently disclosed system and method with N=1 (i.e., a single UUT, or n=1 in FIG. 5). This is because, in this case, the handling time dominates, and so the test and configuration time will be masked with the alternating method and N=1 (since the total U+L≧TC$_T$). Accordingly, using the system and method disclosed herein with N=1 provides an optimal throughput.
2. N>1. In this second range, there exists a minimum N that will provide a maximum achievable throughput and maximum tester utilization. In this case, the number of UUTs that are to be tested and configured in parallel is two or more (i.e., n≧2 in FIG. 5), and therefore parallel test and configuration is used. As in the first range above, the handling time will be greater than or equal to the total test and configuration time (total $U+L \geq TC_T$) for a given value of N, and so it dominates the throughput when using the presently disclosed method.

3. $N=\infty$. When N is infinite, the handling time (U+L) is equal to the sequential test and configuration time ($T_S+C_S$) In this case, the value for N that gives the optimal throughput is very large. This will likely make it impractical to achieve optimal throughput and tester utilization. Increasing N continues to improve throughput, and as N becomes very large, the throughput approaches the optimal 1/(U+L) and tester utilization is approaching 100%.

4. $N<0$ (i.e., N is negative). In this range, the test time, specifically, the sequential test and configuration time ($T_S+C_S$), is greater than the handling time (U+L) Because it is impossible to have a negative number of UUTs, this case is similar to N being infinite, in which the value for N must be very large to approach the optimal throughput. When N is negative, the sequential test and configuration time dominates the throughput, and the handling time is masked using the presently disclosed method. So, as N increases, the throughput approaches $1/(T_S+C_S)$.

The embodiments disclosed herein will be better understood with reference to the following illustrative examples. The four diagrams depicted in FIGS. 7-10 illustrate exemplary test, configuration, and handling times corresponding to the four ranges of N, as described above. These diagrams may be used to compare the presently disclosed parallel test method with conventional test methods such as multi-site testing, ganged testing, and massively parallel testing methods. The four diagrams demonstrate that testers promoting conventional parallel test and configuration methods are not cost effective when compared to the presently disclosed method. When using multi-site, ganged or massively parallel testers, merely increasing N to a value as large as the tester can handle does not result in a corresponding increase in throughput for configuration and test.

A comparison of various parallel test methods may be made by considering the throughputs that they can achieve. As described above, "throughput" is defined herein as the number of UUTs that finish test and configuration per unit time. For the presently disclosed method, the throughput is calculated by determining which part of the throughput dominates, e.g., either the handling time or the test/configuration time. When the handling dominates, the throughput TP may be expressed as $$TP=N/(U+L). \quad (4)$$

This is the case for the first and second ranges of N described above. For the third and fourth ranges of N described above, the test and configuration time dominates the throughput, which may be expressed as $$TP=N/TC_T. \quad (5)$$

With conventional parallel test methods, the throughput is typically calculated as $$TP=N/(TC_T+U+L). \quad (6)$$

Figure 7:
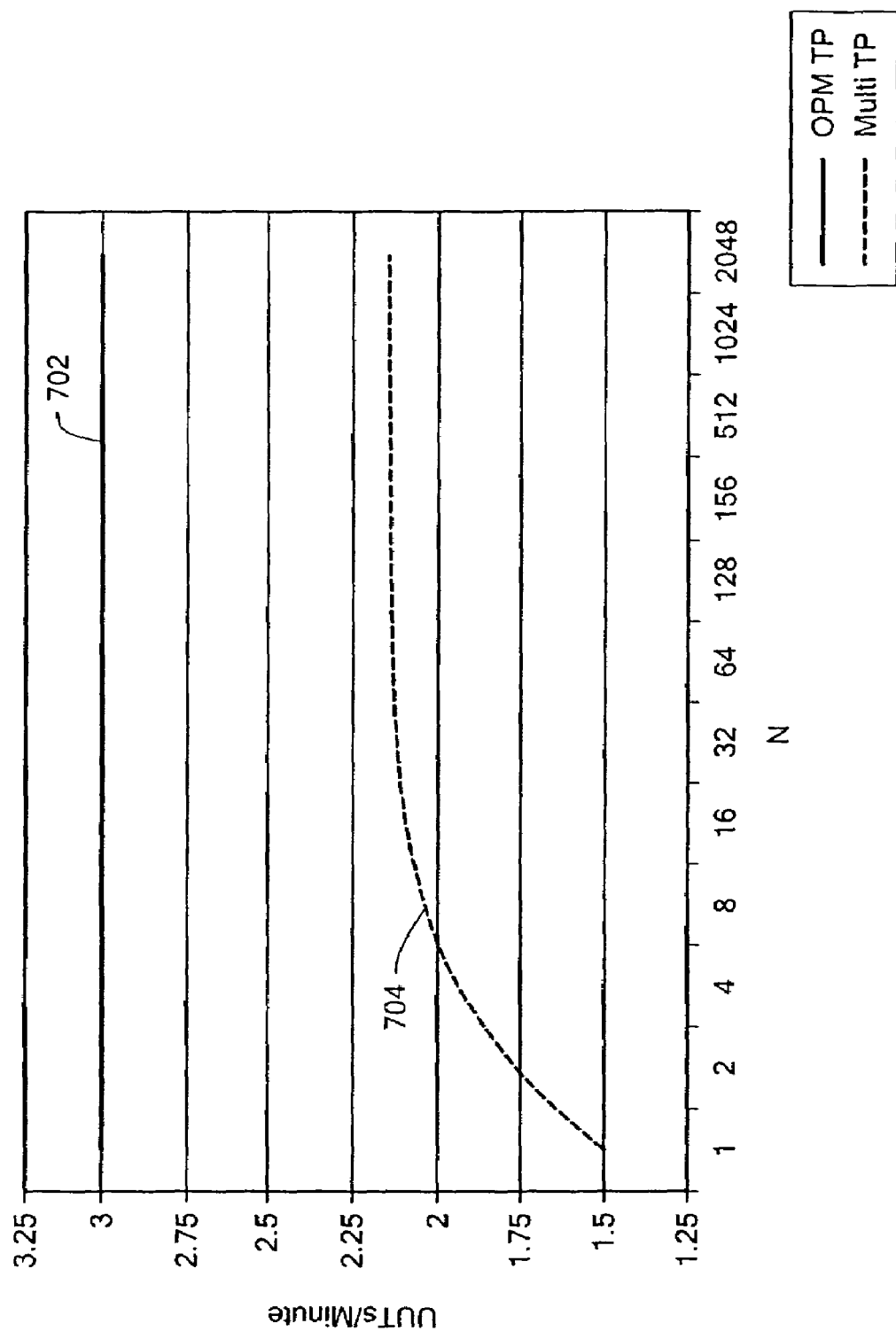
FIG. 7 is a first diagram illustrating the throughput of the system of FIG. 5.

For the example of FIG. 7, the handling, test, and configuration times are $TC_P=12$ s, $T_S=7$ s, $C_S=0.9$ s, $U=10$ s, and $L=10$ s. Calculating N for these times results in a value in the first range described above, in which $0<N\leq1$. To illustrate that the maximum achievable throughput is obtained for N=1 in this case, the throughput for various values of N are plotted in FIG. 7. The throughput values are depicted along the Y-axis in UUTs/minute. Values of TP for the presently disclosed method are plotted as the "OPM (Optimum Parallel Method) TP" line 702, and the values of TP for a multi-site tester are plotted and labeled as "Multi TP" 704. As shown in FIG. 7, an optimal throughput using the presently disclosed method is achieved with a value of N=1. It is noted that increasing N for the presently disclosed method does not change the throughput. This is because, when using this method and $0<N\leq1$, the test and configuration time is less than the handling time (i.e., the test and configuration time is masked), and the handling time therefore determines the throughput. In addition, as shown in FIG. 7 for the conventional multi TP 704 method, the throughput does not reach the maximum throughput provided by the OPM TP 702. Further, when using conventional parallel methods, a much larger N is required to reach a throughput comparable to that of the presently disclosed parallel test method.

Figure 8:
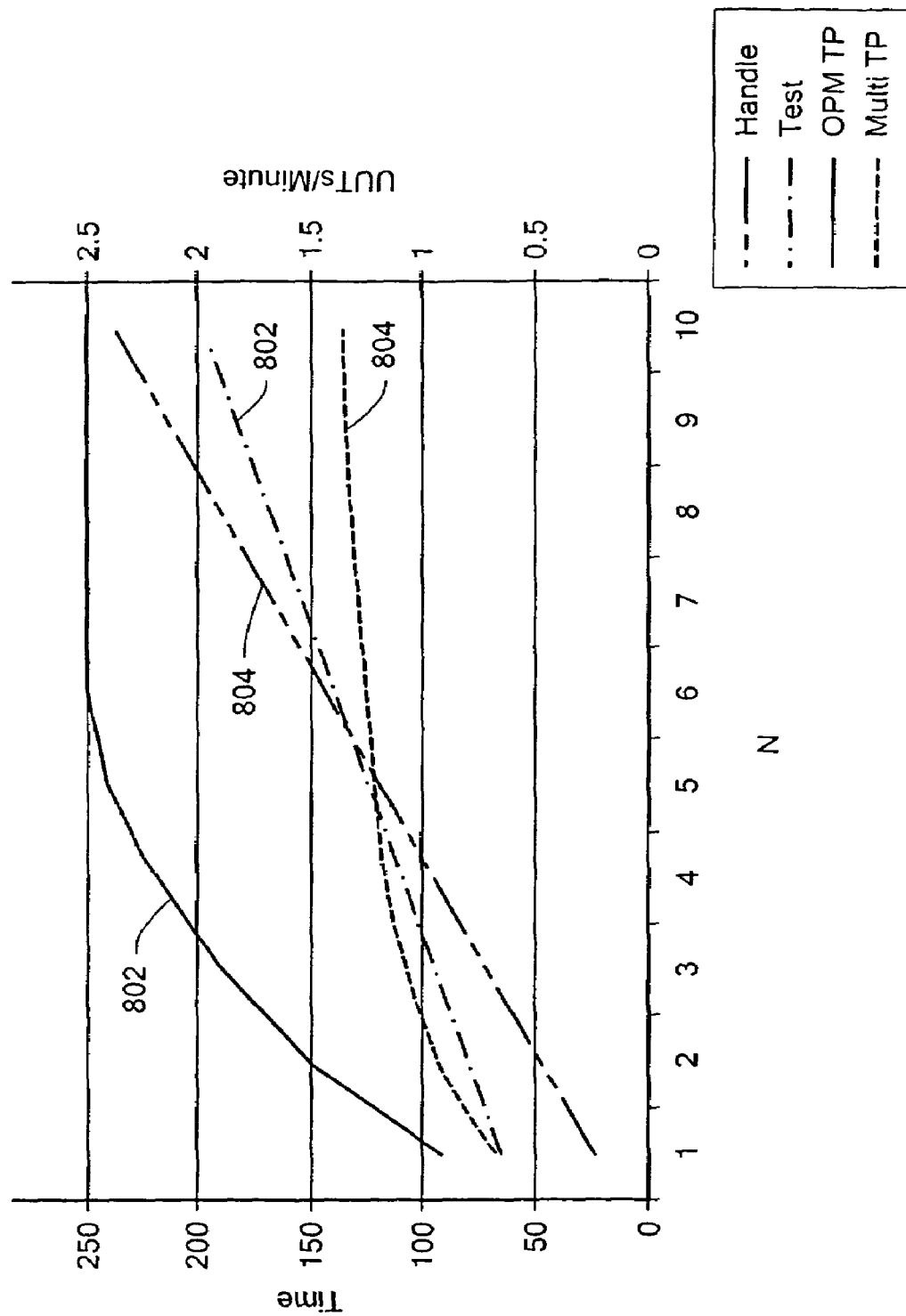
FIG. 8 is a second diagram illustrating the throughput and test and handling times of the system of FIG. 5.

FIG. 8 depicts an illustrative example in which N is in the second range described above (N>1). The handling, test, and configuration times for this diagram are as follows: $TC_P=50$ s, $T_S=5$ s, $C_S=10$ s, $U=15$ s, and $L=9$ s. In this case, calculating N yields N=6 (i.e., CEIL(5.5)). To further illustrate the presently disclosed parallel test method, FIG. 8 includes plots of the total handling time, N*(U+L), and the total test and configuration time, $TC_T=TC_P+N*(T_S+C_S)$, which are labeled "Handle" 804 and "Test" 802, respectively. These are plotted as "Time" in seconds (along the Y-axis), and the throughput values are again plotted as UUTs/minute. The point at which the total handling time 804 and the total test and configuration time 802 cross in FIG. 8 is at the minimum value of N (N=6). This is the point where the optimal throughput occurs when the presently disclosed parallel test method is used, as illustrated by OPM TP 802. Increasing N beyond this point using the presently disclosed method does not increase the throughput. Using a larger N still gives the maximum achievable throughput, but at the expense of reducing the tester utilization. Using a larger N may also add unnecessarily to the cost of the tester or the handling, as more parallel test resources are needed. The tester also incurs more idle time, as it needs to wait for the extra handling to complete. Accordingly, using the presently disclosed parallel test system and method, the minimum N that provides both maximum throughput and tester utilization can be calculated, allowing the cost of the tester and handler to be reduced.

It is noted that for conventional parallel test methods, a much larger N is needed and the throughput still does not reach the maximum achievable throughput provided by the presently disclosed parallel test method (see, e.g., multi TP 804). Only when the sequential test and configuration times are zero does the throughput of the conventional parallel test methods approach that of the presently disclosed method, and then only for very large N.

Figure 9:
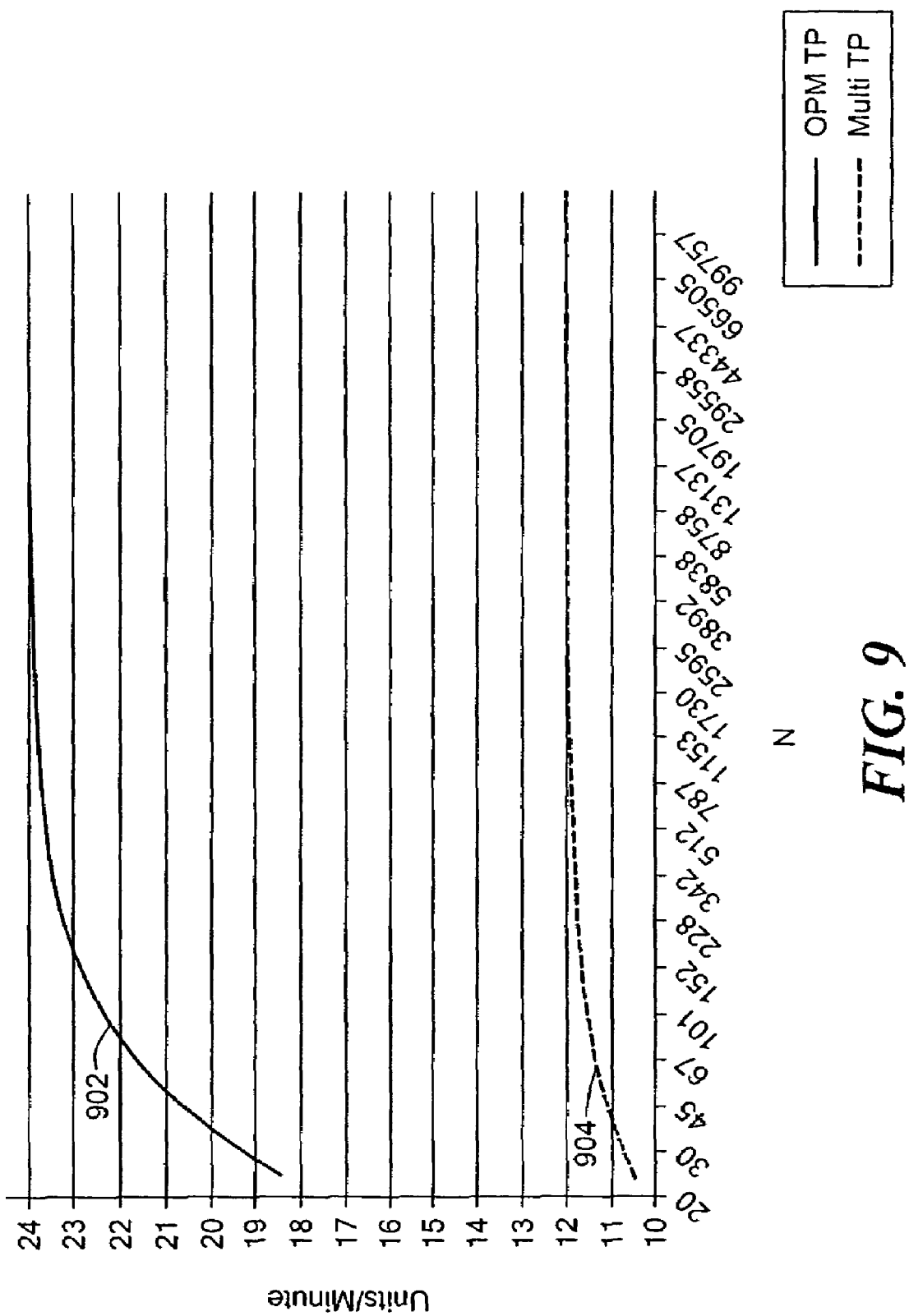
FIG. 9 is a third diagram illustrating the throughput of the system of FIG. 5.

FIG. 9 depicts an illustrative example in which N is in the third range described above (N is infinite). The handling, test, and configuration times for this example are $TC_P=15$ s, $T_S=0.5$ s, $C_S=2$ s, $U=1.25$ s, and $L=1.25$ s. As described above, a large value of N is needed to achieve maximum achievable throughput and tester utilization. The total test and configuration time $TC_T=TC_P+N(T_S+C_S)$ dominates the throughput in this case, and the handling time is masked. This masking occurs because for this range of N, the handling time (U+L) is equal to the sequential test and configuration time ($T_S+C_S$). When this occurs, the overhead time for the parallel test method is just that of the parallel test and configuration time $TC_P$. Accordingly, as N becomes very large, the overhead time of $TC_P$ becomes negligible in the total test and configuration time, and the throughput approaches $1/(T_S+$ $C_S$). This effect can be seen by OPM TP 902. FIG. 9 also demonstrates that the presently disclosed method achieves an optimal throughput level using a single test resource. As shown in FIG. 9, even as N reaches the point of diminishing returns, the throughput of the presently disclosed parallel test method is twice that of conventional parallel test methods (see, e.g., multi TP 904).

Figure 10:
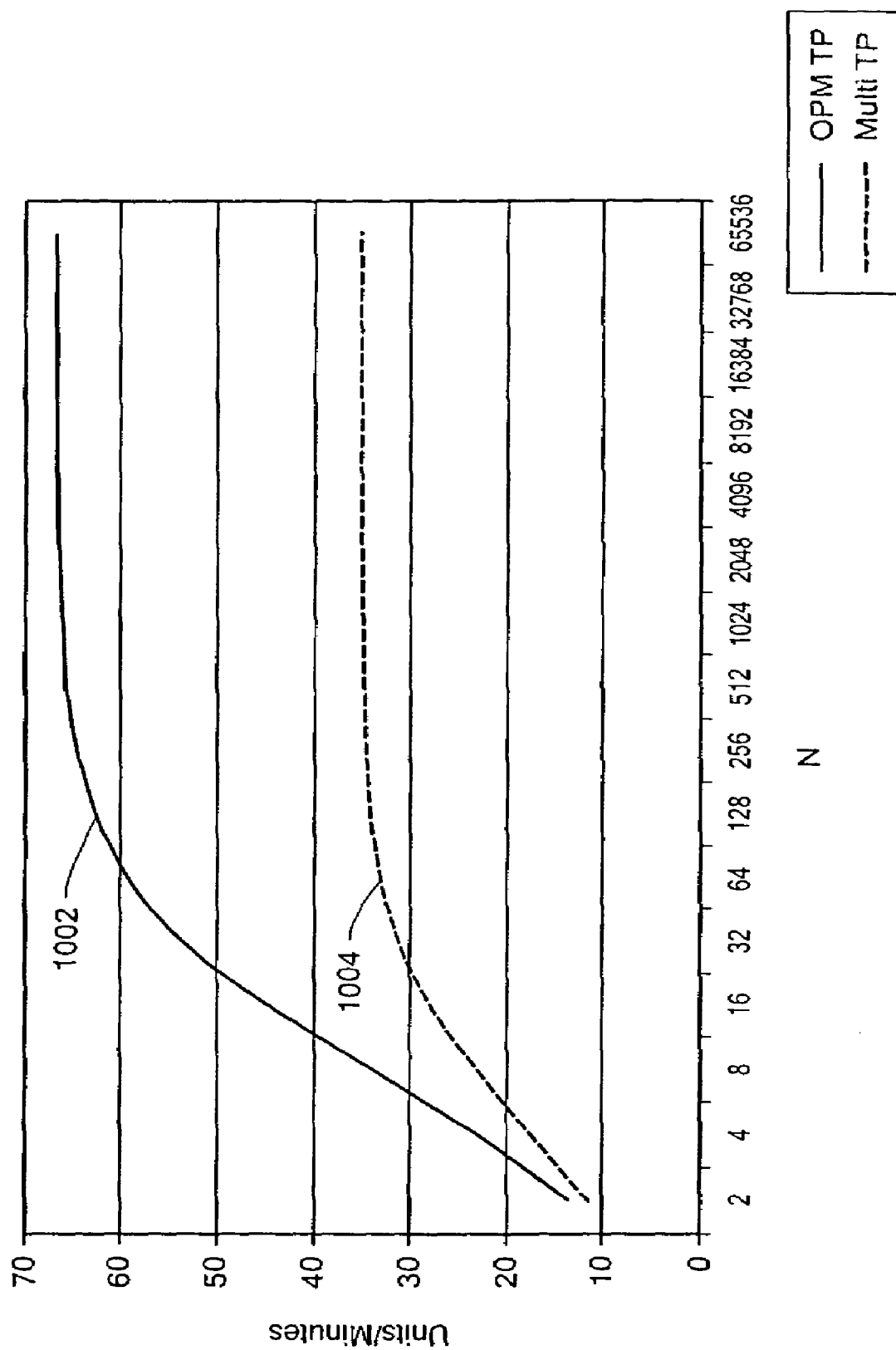
FIG. 10 is a fourth diagram illustrating the throughput of the system of FIG. 5.

FIG. 10 depicts an illustrative example in which N<0 (N is negative), as described for the fourth range. The handling, test and configuration times for this example are $TC_P$=7 s, $T_S$=0 s, $C_S$=0.9 s, U=0.4 s, and L=0.4 s. As described above, when N falls into this negative range, it does not indicate a value providing for optimal throughput and maximum tester utilization. Rather, this is similar to the illustrative example of FIG. 9, in which increasing N continues to increase the throughput up to a limit. As shown in FIG. 10, OPM TP 1002 increases with N, and approaches $1/(T_S+C_S)$ as N becomes large. In addition, as with the previous example, the throughput of the presently disclosed method is approximately twice that of conventional parallel test methods (see, e.g., multi TP 1004).

It will further be appreciated by those of ordinary skill in the art that modifications to and variations of the above-described system and method for optimizing the manufacturing test and configuration throughput of electronic circuits and systems may be made without departing from the inventive concepts disclosed herein. Accordingly, the invention should not be viewed as limited except as by the scope and spirit of the appended claims.

What is claimed is:

1. A system for testing or programmably configuring a plurality of electronic circuits, comprising:
   at least one first sub-system including
      a first test bus, and
      a plurality of first addressable test controllers coupled to the first test bus and coupleable to a plurality of first electronic circuits, the first electronic circuits being communicably coupleable to the first test bus via the first addressable test controllers, respectively;
   at least one second sub-system including
      a second test bus, and
      a plurality of second addressable test controllers coupled to the second test bus and coupleable to a plurality of second electronic circuits, the second electronic circuits being communicably coupleable to the second test bus via the second addressable test controllers, respectively;
   electronic circuit handling equipment configured to load the first and second electronic circuits into first and second pluralities of test fixtures respectively, and to unload the first and second electronic circuits from the first and second pluralities of test fixtures, respectively, the first and second pluralities of test fixtures corresponding to the first and second sub-systems, respectively;
   and a test controller coupled to the plurality of first addressable test controllers and the plurality of second addressable test controllers via the first and second test buses, respectively, the test controller being operative to provide input data to the first and second addressable test controllers via the first and second test buses respectively,
   wherein the plurality of first addressable test controllers are operative to apply, substantially in parallel, the input data to the plurality of first electronic circuits and to receive, substantially in parallel, output data from the plurality of first electronic circuits for testing or configuring the plurality of first electronic circuits,
   wherein the plurality of second addressable test controllers are operative to apply, substantially in parallel, the input data to the plurality of second electronic circuits, and to receive, substantially in parallel, output data from the plurality of second electronic circuits, for testing or configuring the plurality of second electronic circuits,
   the plurality of first and second addressable test controllers being further operative to test or configure the first and second electronic circuits, respectively, in an alternating fashion,
   wherein the handling equipment is operative to perform at least one of unloading and loading the electronic circuits corresponding to one of the first and second sub-systems while the electronic circuits corresponding to the other one of the first and second sub-systems are being tested or configured, and
   wherein the time required for testing or configuring the circuits is substantially equal to the time required for unloading and loading the circuits.

2. The system of claim 1 wherein
   N=the number of first circuits, the number of second circuits being equal to the number of first circuits,
   TC=the time required for testing or configuring N circuits,
   U=the time required for unloading each circuit,
   L=the time required for loading each circuit, and
   wherein N=ceiling[TC/[U+L]].

3. The system of claim 1 wherein
   N=the number of first circuits, the number of second circuits being equal to the number of first circuits,
   $TC_P$=the time required for performing parallel testing or configuration of up to N circuits,
   $T_S$=the time required for performing sequential testing of up to N circuits,
   $C_S$=the time required for performing sequential configuration of up to N circuits,
   U=the time required for unloading each circuit,
   L=the time required for loading each circuit, and
   wherein N=ceiling[$TC_P$/[U+L−$T_S$−$C_S$]].

4. A method for testing or programmably configuring a plurality of electronic circuits, comprising the steps of:
   Providing at least one first sub-system including
      a first test bus, and
      a plurality of first addressable test controllers coupled to the first test bus and coupleable to a plurality of first electronic circuits, the first electronic circuits being communicably coupleable to the first test bus via the first addressable test controllers, respectively;
   providing at least one second sub-system including
      a second test bus, and
      a plurality of second addressable test controllers coupled to the second test bus and coupleable to a plurality of second electronic circuits, the second electronic circuits being communicably coupleable to the second test bus via the second addressable test controllers, respectively;
   unloading the plurality of electronic circuits from a selected one of first and second pluralities of test fixtures corresponding to the first and second sub-systems, respectively, and loading the plurality of electronic circuits into the selected one of first and second pluralities of test fixtures by electronic circuit handling equipment;
   in an applying step, applying, substantially in parallel, input data to a selected one of the plurality of first electronic circuits and the plurality of second electronic circuits by the plurality of the first addressable test controllers and the plurality of the second addressable test controllers, respectively; and in a receiving step, optionally receiving, substantially in parallel, output data from the selected one of the plurality of first circuits and the plurality of second circuits by the plurality of the first addressable test controllers and the plurality of the second addressable test controllers, respectively, wherein the applying and receiving steps are performed by the plurality of the first addressable test controllers and the plurality of the second addressable test controllers for testing or configuring the first and second electronic circuits, respectively, in an alternating fashion, wherein at least one of the steps of unloading and loading the electronic circuits corresponding to one of the first and second sub-systems is performed by the handling equipment while the electronic circuits corresponding to the other one of the first and second sub-systems are being tested or configured, and Conclusion wherein the time required for testing or configuring the electronic circuits is substantially equal to the time required for unloading and loading the electronic circuits.

5. The method of claim 4 wherein

N=the number of first circuits, the number of second circuits being equal to the number of first circuits, TC=the time required for testing or configuring N circuits, U=the time required for unloading each circuit, L=the time required for loading each circuit, and wherein N=ceiling[TC/[U+L]].

6. The method of claim 4 wherein

N=the number of first circuits, the number of second circuits being equal to the number of first circuits, $TC_P$=the time required for performing parallel testing or configuration of up to N circuits, $T_S$=the time required for performing sequential testing of up to N circuits, $C_S$=the time required for performing sequential configuration of up to N circuits, U=the time required for unloading each circuit, L=the time required for loading each circuit, and wherein N=ceiling[$TC_P$/[U+L−$T_S$−$C_S$]].

7. A method of testing or programmably configuring a plurality of electronic circuits, for use in conjunction with a test system configured to test multiple partitions of circuits in a concurrent fashion, the method comprising the steps of:

partitioning the plurality of electronic circuits into multiple partitions of circuits, each of the respective partitions including N circuits, N being a positive integer;

for each partition of N circuits:
in a loading step, loading the partition of N circuits into the teat system, a first amount of time L being required to load each circuit included in the partition of N circuits;

in a testing or programmably configuring step, testing or programmably configuring the partition of N circuits using the test system, a second amount of time TC being required to test or programmably configure the N circuits included in the partition of N circuits; and in an unloading step, unloading the partition of N circuits from the test system, a third amount of time U being required to unload each circuit included in the partition of N circuits, wherein the loading, the testing or programmably configuring, and the unloading steps for each partition of N circuits are performed sequentially and at least partially concurrently with the loading, the testing or programmably configuring, and the unloading steps for at least one other partition of N circuits, and wherein N is equal to ceiling[TC/[U+L]], N corresponding to the number of circuits included in at least two respective partitions of circuits being tested or programmably configured in a concurrent fashion by the test system.

8. The method of claim 7 wherein:

$TC_P$ is equal to a fourth amount of time required to perform concurrent testing or programmable configuration of up to N circuits;

$T_S$ is equal to a fifth amount of time required to perform sequential testing of up to N circuits; and $C_S$ is a sixth amount of time required to perform sequential configuration of up to N circuits, and wherein N is alternatively equal to ceiling [$TC_P$/[U+L−$T_S$−$C_S$]].

* * * * *

UNITED STATES PATENT AND TRADEMARK OFFICE
CERTIFICATE OF CORRECTION

PATENT NO. : 7,406,638 B2
APPLICATION NO. : 10/896646
DATED : July 29, 2008
INVENTOR(S) : Christopher J. Clark et al.

It is certified that error appears in the above-identified patent and that said Letters Patent is hereby corrected as shown below:

Column 9, line 2, "Uhd1-$U_N$" should read --$U_1$-$U_N$--;

Column 14, line 39, claim 4, "for" should read --of--;

Column 14, line 41, claim 4, "Providing" should read --providing--;

Column 14, line 59, claim 4, "of first" should read --of the first--;

Column 15, line 17, claim 4, "second..." should not start a new line and should continue on line 16; and Column 15, line 18, claim 4, "Conclusion" should be deleted.

Signed and Sealed this

Twenty-second Day of December, 2009

David J. Kappos
*Director of the United States Patent and Trademark Office*